United States Patent [19]
Piirainen

[11] Patent Number: 5,786,703
[45] Date of Patent: Jul. 28, 1998

[54] METHOD AND DEVICE FOR TESTING OF AN INTEGRATED CIRCUIT

[75] Inventor: Olli Piirainen, Oulu, Finland

[73] Assignee: Nokia Telecommunications Oy, Espoo, Finland

[21] Appl. No.: 624,423

[22] PCT Filed: Sep. 30, 1994

[86] PCT No.: PCT/FI94/00439

§ 371 Date: Apr. 1, 1996

§ 102(e) Date: Apr. 1, 1996

[87] PCT Pub. No.: WO95/10048

PCT Pub. Date: Apr. 13, 1995

[30] Foreign Application Priority Data

Oct. 1, 1993 [FI] Finland ................. 934327

[51] Int. Cl.⁶ ............................................. G01R 31/28
[52] U.S. Cl. ........................................ 324/763; 371/22.5
[58] Field of Search ................................ 324/763, 765, 324/537; 371/22.5, 22.6

[56] References Cited

U.S. PATENT DOCUMENTS

| | | | |
|---|---|---|---|
| 4,479,088 | 10/1984 | Stopper | 324/537 |
| 4,817,093 | 3/1989 | Jacobs | 371/22.5 |
| 4,961,053 | 10/1990 | Krug | 324/537 |
| 5,053,700 | 10/1991 | Parrish | 324/537 |
| 5,109,190 | 4/1992 | Sakashita et al. | 324/73.1 |
| 5,241,266 | 8/1993 | Ahmad et al. | 371/22.5 |

FOREIGN PATENT DOCUMENTS

| | | |
|---|---|---|
| 0 514 700 | 11/1992 | European Pat. Off. . |
| 42 21 748 | 3/1993 | Germany . |

OTHER PUBLICATIONS

Abramovici, Miron et al., *Digital Systems Testing and Testable Design*, Nov. 1991, pp. 12–17.

*IEEE Standard Test Access Port and Boundary-Scan Architecture*, May 21, 1990.

*Primary Examiner*—Ernest F. Karlsen
*Attorney, Agent, or Firm*—IP Group of Pillsbury Madison & Sutro LLP

[57] ABSTRACT

A method for testing an integrated circuit that has a testing portion for testing the circuit card and/or other circuits connected to the integrated circuit after the integrated circuit has been assembled onto the circuit card, inputs for controlling the testing portion, and test structures for testing the internal operations of the integrated circuit. To keep the number of the inputs to the circuit low, a test mode is defined for the testing portion, in which test mode one of the inputs of the testing portion is connected to the test structures for the internal operations of the integrated circuit, and when the internal operations of the integrated circuit are tested, the testing portion is set in the test mode, whereupon the internal test structures of the integrated circuit can be controlled from the input of the testing portion.

5 Claims, 1 Drawing Sheet

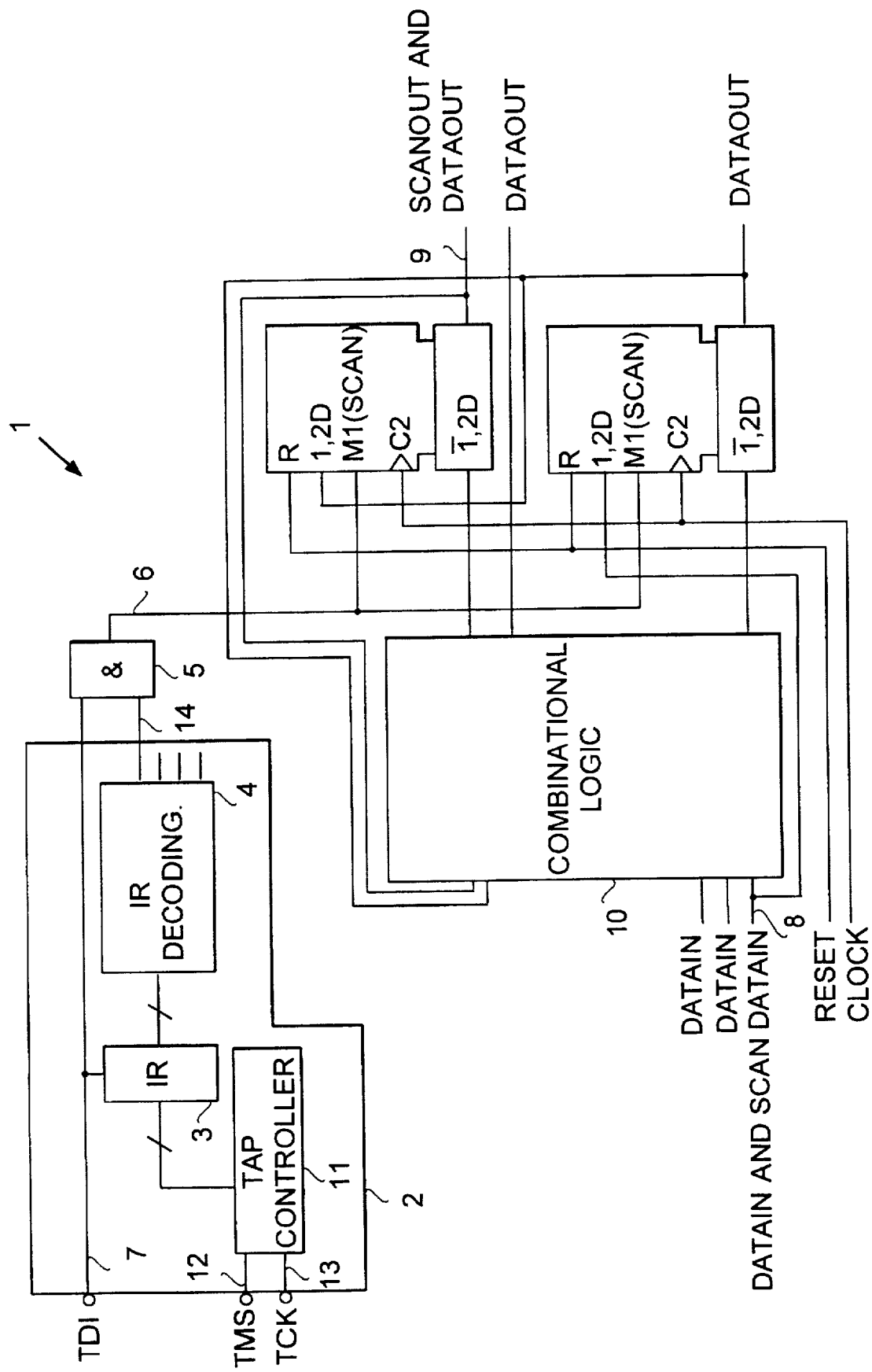

METHOD AND DEVICE FOR TESTING OF AN INTEGRATED CIRCUIT

This application is a 371 of PCT/FI94/00439 filed Sep. 30, 1994.

BACKGROUND OF THE INVENTION

The invention relates to a method for testing an integrated circuit, the circuit comprising testing means for testing the circuit card and/or other circuits connected to the integrated circuit after it has been assembled onto the circuit card, inputs for controlling the testing means, and test structures for testing the internal operations of the integrated circuit. The invention also relates to an integrated circuit, comprising testing means for testing the circuit card and/or other circuits connected to the integrated circuit after it has been assembled onto the circuit card, inputs for controlling the testing means, and test structures for testing the internal operations of the integrated circuit.

The invention relates in particular to the testing of the internal operation of an ASIC circuit conducted by a circuit manufacturer in connection with the manufacturing. The aim of this test is to check the operation of the circuits by feeding test data into the inputs of the circuit, after which signals obtained from the outputs of the circuit are monitored. To conduct these tests, so-called scan path test structures have been formed in the circuit during its manufacturing, the test structures being intended solely for in-circuit testing. A separate pin, i.e. an input port, is reserved in the circuit for controlling the scan path test structures. Said pin has proved to be very problematic, since fitting it in the integrated circuit often calls for the use of a larger housing. Scan path testing is described, for example, in *Digital Systems Testing and Testable Design* (by M. Abramovic, M. A. Breuer & A. D. Friedman, Computer Science Press, New York, USA), and therefore it is not described in greater detail in this connection.

In addition to the testing of the internal operation of a single integrated circuit, the entire circuit card onto which the integrated circuit is assembled is also usually tested. For this purpose, test logic needed in particular for this type of testing is built into the integrated circuits. For example, in the ASIC circuits, it is possible to use boundary scan blocks according to the IEEE Standard (The Institute of Electrical and Electronics Engineers, Inc.) 1149.1, the blocks being applicable, among other things, in testing the connections between components assembled onto the circuit board. For the purpose of conducting these tests, the ASIC circuits comprise special pins, i.e. input ports, for controlling the tests.

With an increasing demand for smaller and smaller integrated circuits, it has proved to be necessary to limit the number of pins, i.e. inputs and outputs, in the circuits, since in practice they have a very significant effect on the size of the housing of the integrated circuit. The use of a larger housing may in turn lead into situations, where the size of that circuit card onto which the integrated circuit is to be assembled is too small, wherefore a larger circuit card has to be used.

SUMMARY OF THE INVENTION

The purpose of this invention is to provide a method by means of which the internal structures of an integrated circuit can be tested without, for enabling the testing, having to add extra pins to the circuit. These aims are achieved with a method according to the invention, which is characterized in that a test mode is defined for the testing means, in which test mode one of the inputs of the testing means is connected to the test structures for the internal operations of the integrated circuit, and that when the internal operations of the integrated circuit are tested, the testing means are set in the test mode, whereupon the internal test structures of the integrated circuit can be controlled from the input of the testing means.

The invention is based on the idea that when the test structures required for testing the internal operations of the circuit are connected with the testing means intended for the testing of the connections between the circuits on the circuit board in such a way that a mode where one of the inputs of the testing means is connected to the internal test structures is defined for the testing means, it is not necessary to provide the integrated circuit with a separate pin, i.e. an input, for controlling the internal test structures. Therefore, the size of the housing of the integrated circuit can be decreased, and in addition to this, the in-circuit testing becomes faster, since the solution according to the invention makes it possible to test simultaneously several scan paths. The greatest advantage of the method according to the invention is therefore that it saves space, since the number of pins in the integrated circuit decreases, which thus considerably diminishes the size of the circuit. It is also easy to define several modes for the testing means for testing independently the internal structures of different blocks.

The invention also relates to an integrated circuit, where the method according to the invention can be applied. The circuit according to the invention is characterized in that at least one of the inputs of the testing means is connected to the input of a switching device, which is controlled by means of the testing means, and that a test mode is defined for the testing means, in which mode the switching device allows data fed into its input to propagate from its output, and that the output of the switching device is connected to the test structures of the internal operations of the integrated circuit, whereupon the test structures of the internal operations can be controlled from the input of the testing means by setting the testing means in the test mode.

The major advantages of the integrated circuit according to the invention are thus that the circuit requires fewer pins (inputs/outputs) for testing purposes than known circuits, wherefore the size of the circuit can be decreased and there is no need to control any "extra" pins during the normal operation of the circuit, and that it is faster to test the internal structures of the circuit than in known circuits.

BRIEF DESCRIPTION OF THE DRAWING

The invention will be described in the following in greater detail with reference to the accompanying drawing, in which: The figure is a block diagram of a preferred embodiment of the integrated circuit according to the invention.

DETAILED DESCRIPTION

The ASIC circuit 1 shown in the figure comprises a boundary scan block 2 according to the IEEE Standard (The Institute of Electrical and Electronics Engineers, Inc.) 1149.1, the block being applicable, among other things, in testing the connections between the components on the circuit card after the ASIC circuit shown in the figure is assembled onto the circuit board. The boundary scan block 2 comprises three inputs 7, 12 and 13, and each of them is connected to one of the pins of the ASIC circuit. The TMS input 12 (test mode select input) is used for selecting the test mode, a clock pulse is fed into the TCK input 13 (test clock input), and serial data required for conducting the test is fed from the TDI port 7 (test data input). The testing operation is controlled by means of data obtained from the aforementioned inputs and decoded by a TAP (test access port) controller 11.

The output of the TAP controller 11 is connected to the input of an instruction register (IR) 3. The instruction register is used to select the test to be performed. A decoding block 4 (IR Decoding) of the instruction register is connected to the output of the instruction register, the instruction obtained from the instruction register being interpreted and carried out by means of the decoding block. The couplings by means of which the connections between the components on the circuit board are tested are not shown in the figure. The operation of the boundary scan block 2 is described in greater detail in the standard IEEE-1149.1 IEEE *Standard Test Access Port and Boundary Scan Architecture* (IEEE, 1990, New York, USA).

For the purpose of testing the internal structures of the ASIC circuit 1, the circuit shown in the figure comprises a scan path test structure, intended solely for testing the internal operation of the circuit. The test conducted by means of the scan path is controlled by means of its control input 6. Scan path testing is described for example in *Digital Systems Testing and Testable Design* (by M. Abramovic, M. A. Breuer & A. D. Friedman, Computer Science Press, New York, USA), and therefore it is not described in greater detail in this connection.

For the purpose of testing the internal structures of the ASIC circuit 1, one private instruction defined in the IEEE Standard 1149.1 is reserved in the instruction register 3 of the boundary scan block 2 shown in the figure for controlling the scan path of the ASIC circuit 1; that instruction will hereafter be called the scan mode.

When the scan mode has been selected from the instruction register, that output 14 in the decoding block 4 of the instruction register which indicates the scan mode is activated, i.e. it is given the value "1". In other instruction modes, i.e. when the internal operation of the ASIC circuit is not being tested, the value of the output 14 is "0".

Due to an AND gate 5 placed between the decoding block 4 and the control input 6 of the scan path of the ASIC circuit, the control input 6 remains inactive as long as the output 14 indicating the scan mode is in the passive state. Thus it is ensured that the control input 6 remains inactive during the normal operation of the circuit 10 and during other test modes of the boundary scan block 2. Then the TDI input 7 is used for feeding serial test data, wherefore feeding this test data simultaneously through the control input 6 could lead into error situations.

When the output 14 indicating the scan mode acquires the value "1" after an instruction for the scan mode has been given, the AND circuit 5 is activated, whereupon a control signal supplied from the TDI port 7 can propagate to the control input 6 of the scan mode. Thus the internal testing of the ASIC circuit 1 can be controlled directly by means of the TDI port 7 (test data input), i.e. the testing can be controlled by the input 7 of the boundary scan block 2, and therefore it is not necessary to provide a separate pin (input) in the ASIC circuit 1 for this purpose.

One of the normal inputs of the ASIC circuit, for example input 8, is used as the scan input required by the scan path structure, as shown in the figure. The output of some flip-flop in the scan path is used in turn directly as the scan output required by the scan path structure, for example output 9, as shown in the figure, if it is an output port directly outbound from the circuit 10. If a direct output port of the circuit cannot be selected as the scan output in the scan path, the scan output can be directed to one of the output ports of the circuit by means a multiplexer (not shown in the figure).

It must be understood that the appended description and the figure related thereto describe only one preferred embodiment according to the invention. Therefore, for example the method according to the invention can also be applied in other integrated circuits and not only in ASIC circuits, even though the invention is described -above mainly in connection with ASIC circuits. The preferred embodiments of the method and the integrated circuit according to the invention can thus be modified within the scope of the appended claims.

I claim:

1. A method of testing an integrated circuit after the integrated circuit has been assembled, together with other components, onto a circuit card, the integrated circuit having test structures for testing internal operations of the integrated circuit, said integrated circuit having at least one input for inputting test data to the integrated circuit and at least one output for outputting results from testing of internal operation of the integrated circuit, said method comprising:

providing a testing block having at least one mode in which is operable for testing said circuit card and/or at least one of said other components, said testing block having at least one input for controlling said testing block, and an output normally effectively isolated from, but effectively connected in a test state to said test structures;

providing a signal via said at least one input of said testing block to said testing block for initiating said test state and thereby effectively connecting said testing block to said test structures of said integrated circuit; and controlling said internal test structures of said integrated circuit by providing signals via said at least one input of said testing block to said internal test structures of said integrated circuit, while supporting test data to said integrated circuit via said at least one input of said integrated circuit, and monitoring said at least one output of said integrated circuit.

2. Apparatus for testing an integrated circuit after the integrated circuit has been assembled, together with other components, onto a circuit card, the integrated circuit having test structures for testing internal operations of the integrated circuit, said integrated circuit having at least one input for inputting test data to the integrated circuit and at least one output for outputting results from testing of internal operation of the integrated circuit, said apparatus comprising:

testing block having at least one mode in which is operable for testing said circuit card and/or at least one of said other components, said testing block having at least one input for controlling said testing block, and an output normally effectively isolated from, but effectively connected in a test state to said test structures;

said at least one input of said testing block being arranged for sending a signal for initiating said test state and thereby effectively connecting said testing block to said test structures of said integrated circuit; and said testing block being arranged for controlling said internal test structures of said integrated circuit by providing signals via said at least one input of said testing block to said internal test structures of said integrated circuit, while test data is supplied to said integrated circuit via said at least one input of said integrated circuit, and said at least one output of said integrated circuit is monitored for test results.

3. The apparatus of claim 2 wherein:

said integrated circuit is a synchronous ASIC.

4. The apparatus of claim 2 wherein:

said at least one input of said testing block includes a first input, a second input and a third input;

said first input being arranged to provide a clock pulse;

said second input being arranged to provide data indicating choice between said at least one mode and said test state; and said third input being arranged to provide test data; and said testing block further includes an instruction register which is arranged to select which of a plurality of tests is to be conducted, based on signals received via said at least one in put of said testing block.

5. The apparatus of claim 4 wherein:

said integrated circuit is a synchronous ASIC.

* * * * *